(12) United States Patent
Imai et al.

(10) Patent No.: US 7,153,614 B2
(45) Date of Patent: Dec. 26, 2006

(54) MASK FOR PHOTOLITHOGRAPHY, METHOD OF FORMING THIN FILM, LIQUID CRYSTAL DISPLAY DEVICE, AND METHOD OF PRODUCING THE LIQUID CRYSTAL DISPLAY DEVICE

(75) Inventors: Masato Imai, Kanagawa (JP); Akira Maehara, Kanagawa (JP); Yoko Fukunaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 238 days.

(21) Appl. No.: 10/314,528

(22) Filed: Dec. 9, 2002

(65) Prior Publication Data

US 2003/0165641 A1  Sep. 4, 2003

(30) Foreign Application Priority Data

Dec. 13, 2001  (JP) .............................. 2001-380338

(51) Int. Cl.
*H01L 21/027* (2006.01)
(52) U.S. Cl. .......................... 430/5; 430/321; 430/396
(58) Field of Classification Search .................... 430/5, 430/319, 321, 396
See application file for complete search history.

(56) References Cited

FOREIGN PATENT DOCUMENTS

JP          2000-075305 A   *  3/2000

* cited by examiner

*Primary Examiner*—John A. McPherson
(74) *Attorney, Agent, or Firm*—Robert J. Depke; Rockey, Depke, Lyons & Kitzinger LLC.

(57) ABSTRACT

A mask for photolithography in which a semi-transmission film is formed so that the phase difference of lights passing through a semi-transmission portion and a transmission portion of the mask for photolithography is between $(-¼+2m).\pi$ and $(¼+2m).\pi$ inclusive, where m is an integer. The invention makes it possible to efficiently and properly form a thin film having a multi-step structure by a single process.

7 Claims, 13 Drawing Sheets

POSITION ON SUBSTRATE

PHASE DIFFERENCE φ = 0 (IN PHASE)

PHASE DIFFERENCE φ = π (OPPOSITE PHASES)

$\phi = \frac{1}{8}\pi$ $\phi = \frac{1}{4}\pi$ $\phi = \frac{1}{2}\pi$ $\phi = \frac{3}{4}\pi$

MASK FOR PHOTOLITHOGRAPHY, METHOD OF FORMING THIN FILM, LIQUID CRYSTAL DISPLAY DEVICE, AND METHOD OF PRODUCING THE LIQUID CRYSTAL DISPLAY DEVICE

This application claims priority to Japanese Patent Application Number JP2001-380338 filed Dec. 13, 2001, which is incorporated herein by reference.

BACKGROUND OF THE INVENTION

1. Field of the Invention

The present invention relates to a mask for photolithography having a plurality of transmission areas, a method of forming a thin film using the mask for photolithography, a liquid crystal display device having a thin-film pattern comprising portions with different thicknesses formed on a glass substrate by a single process, and a method of producing the liquid crystal display device.

2. Description of the Related Art

An increase in the size of a screen of a liquid crystal display device, such as a liquid crystal display, and an increase in the efficiency of a production process have caused a photolithography process for forming a thin-film pattern onto a glass substrate used in the liquid crystal display device to become a large-scale process. In carrying out such a large-scale photolithography process, a large photo-mask, which allows a large substrate material to be efficiently exposed, is used because exposure using a stepper results in poor production efficiency.

For example, diversification of liquid crystal modes has caused a demand for a multi-step film structure that is formed by carrying out the photolithography process a plurality of times. However, an increase in the number of times the photolithography process is carried out increases the process time. This applies to, for example, the case where color filters are formed with multiple steps in forming reflective-and-transmissive liquid crystals, and the case where a thin-film pattern with multiple steps is formed on a glass substrate for, for example, providing multiple gaps. This increase in the number of times the photolithography process is carried out is an obstacle to reducing costs and lead time.

A method using a halftone mask having a plurality of transmission areas of different light transmittances formed on one mask substrate is one means for solving the above-described problems. In this method, by forming transmission areas of different light transmittances in a photo-mask, the amount of exposure light on each portion of a substrate (hereinafter referred to as "the target substrate") onto which a thin-film pattern is formed is adjusted, so that a thin-film pattern comprising portions with a plurality of thicknesses is formed by carrying out the photolithography process once. This method makes it possible to form a thin-film pattern having a multi-step structure by carrying out the photolithography process once because a photosensitive material on the target substrate is exposed to exposure light of different intensities.

However, when the above-described halftone mask is used, interference between diffracted lights occurs at the boundaries of the transmission areas having different light transmittances. When the diffracted lights interfere to weaken each other, film-diminishing steps are formed in the thin-film pattern formed on the target substrate because there are portions thereof exposed to weaker light. For this reason, when the halftone photo-mask is used, it is difficult to properly form a thin-film pattern having a multi-step structure by a single process due to the effects of interference between the diffracted lights mentioned above.

In order to eliminate the effects of diffracted lights, it is desirable to carry out the photolithography process by bringing the photo-mask and the target task as close to each other as possible. However, when the photo-mask and the target substrate contact each other due to the effects of, for example, flexing of the photo-mask or the waviness of the target substrate, contamination or scratching of the photo-mask, improper film deposition, or the like, occurs. In particular, a photo-mask needs to be replaced every time contamination occur, thereby reducing production efficiency and increasing costs, so that it is necessary to perform exposure with a predetermined gap between the photo-mask and the target substrate. In addition, when the size of the substrate material, flexing of the photo-mask and the waviness of the target substrate tend to increase, so that it is necessary to make the gap between the photo-mask and the target substrate even larger. Combined with an increase in the fineness of a mask pattern, this increases the effects of diffracted lights on the thin-film pattern on the target substrate.

SUMMARY OF THE INVENTION

Accordingly, it is an object of the present invention to provide a mask for photolithography which can be used in a large-scale photolithography process and which makes it possible to efficiently and properly form a thin-film pattern having a multi-step structure by a single process and to make use of a film-diminishing step for the form of the thin-film pattern, and a method of forming a thin film using the mask. It is also an object of the present invention to provide a liquid crystal display device having the thin-film pattern formed on a substrate by the method of forming a thin film, and a method of producing the liquid crystal display device.

To overcome the above-described problems, according to an aspect of the present invention, there is provided a mask for photolithography comprising a light-shielding area, and a plurality of transmission areas having different light transmittances, wherein the phase difference of lights passing through adjacent transmission areas of the plurality of transmission areas is between $(-1/4+2\,m).\pi$ and $(1/4+2\,m).\pi$ inclusive, where m is an integer.

According to another aspect of the present invention, there is provided a method of forming a thin film in which exposure is carried out using the above-described mask for photolithography, with the mask for photolithography being disposed with a gap having a size between 50 μm and 500 μm inclusive being provided between it and what is to be subjected to a thin-film forming operation.

According to still another aspect of the present invention, there are provided a liquid crystal display device and a method of producing the liquid crystal display device, wherein a thin film having a multi-step structure is formed onto what is to be subjected to a thin-film forming operation by carrying out the method of forming a thin film in a photolithography process.

In the mask for photolithography, the method of forming a thin film, the liquid crystal display device, and the method of producing the liquid crystal display device of the present invention, the phase difference of lights passing through adjacent transmission areas are restricted within a predetermined range in order to restrict a reduction in the intensity of exposure light caused by interference between diffracted lights, thereby reducing the size of a film-diminishing step formed in the thin-film pattern. Therefore, according to the mask for photolithography, the method of forming a thin film, the liquid crystal display device, and the method of producing the liquid crystal display device of the present invention, a thin-film pattern having a multi-step structure is formed by a single process without improper film deposition.

According to the method of forming a thin film, the liquid crystal display device, and the method of producing the liquid crystal display device of the present invention, the photolithography process is carried out with a relatively large gap having a size between 50 μm and 500 μm inclusive being provided between the mask for photolithography and what is to be subjected to a thin-film forming operation. Therefore, even if, for example, a large substrate is to be used, it is possible to prevent contact between a substrate material and a photo-mask, so that a large-scale photolithography process can be carried out.

According to still another aspect of the present invention, there is provided a mask for photolithography comprising a light-shielding area and a plurality of transmission areas, wherein the phase difference of lights passing through adjacent transmission areas of the plurality of transmission areas is arbitrarily set.

According to still another aspect of the present invention, there is provided a method of forming a thin film in which exposure is carried out using the above-described mask for photolithography, with the mask for photolithography being disposed with a gap having a size between 50 μm and 500 μm inclusive being provided between it and what is to be subjected to a thin-film forming operation.

According to still another aspect of the present invention, there are provided a liquid crystal display device and a method of producing the liquid crystal display device, wherein a thin film having a multi-step structure is formed onto what is to be subjected to a thin-film forming operation by carrying out the method of forming a thin film in a photolithography process.

In the mask for photolithography, the method of forming a thin film, the liquid crystal display device, and the method of producing the liquid crystal display device of the present invention, the phase difference of lights passing through adjacent transmission areas is arbitrarily set, so that exposure light made weaker by interference between diffracted lights is used to form a desired film-diminishing step in a thin-film pattern. Therefore, according to the mask for photolithography, the method of forming a thin film, the liquid crystal display device, and the method of producing the liquid crystal display device of the present invention, it is possible to efficiently form by a single process a thin-film pattern having a multi-step structure in which the number of steps thereof is equal to or greater than the number of transmission areas of the mask for photolithography.

According to the method of forming a thin film, the liquid crystal display device, and the method of producing the liquid crystal display device of the present invention, the photolithography process is carried out with a relatively large gap having a size between 50 μm and 500 μm inclusive being provided between the mask for photolithography and what is to be subjected to a thin-film forming operation. Therefore, even if, for example, a large substrate is to be used, it is possible to prevent contact between a substrate material and a photo-mask, so that a large-scale photolithography process can be carried out.

DESCRIPTION OF THE PREFERRED EMBODIMENT

Hereunder, a description of a specific embodiment of the present invention will be given in detail with reference to the drawings.

Figure 1:
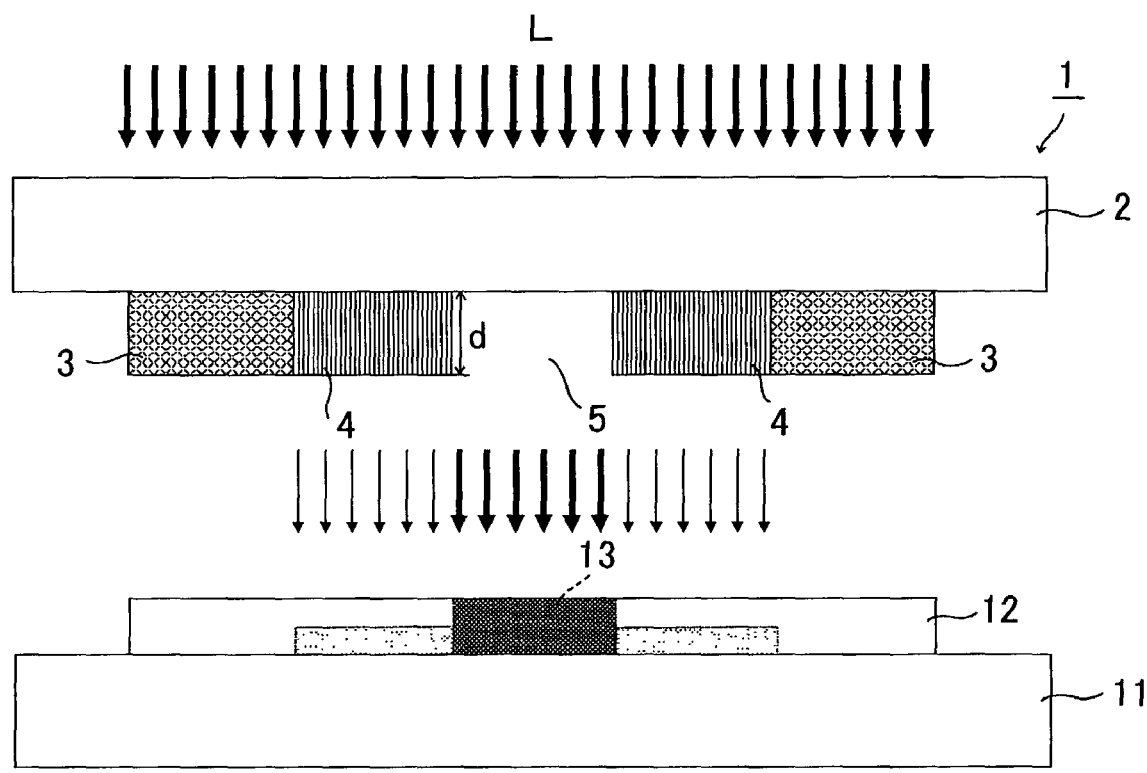
FIG. 1 illustrates a photolithography process using a photo-mask to which the present invention is applied.
Figure 2:
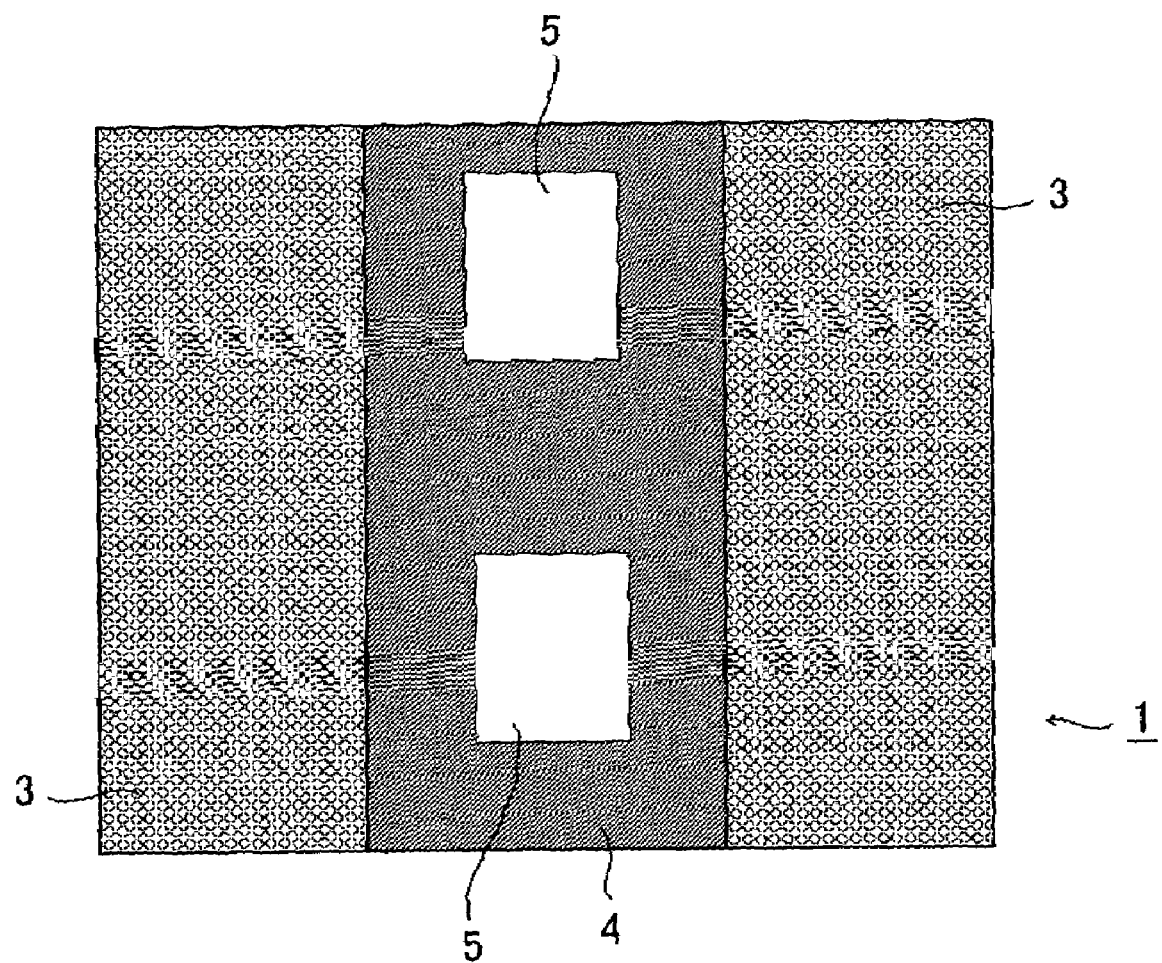
FIG. 2 is a bottom view of the photo-mask.

As shown in FIGS. 1 and 2, in a photo-mask 1, three types of areas having different light transmittances, more specifically, one light-shielding area and two types of transmission areas, are formed on a transparent mask substrate 2. These areas are a light-shielding portion 3 whose transmittance of exposure light L is 0% or close to 0%, a semi-transmission portion 4 whose transmittance of the exposure light L is between 0% to 100%, and a transmission portion 5 whose transmittance of the exposure light L is 100% or close to 100%. Here, the light transmittances of the light-shielding portion 3, the semi-transmission portion 4, and the transmission portion 5 are relative light transmittances when the transmittance of the exposure light L of the mask substrate 2 itself is 100%. As shown in FIG. 1, the photo-mask 1 is used when forming a thin-film pattern 13 by exposing a resist layer 12 formed by applying a negative photosensitive material to a substrate 11 onto which a thin film is formed in a photolithography process. Here, although it is assumed that a negative photosensitive material is used, a positive photosensitive material may be used when the relationship between the shielding of light and the transmission of light of the photo-mask 1 is switched.

When a light-shielding film is formed on the mask substrate 2, the light-shielding portion 3 whose transmittance of the exposure light L is 0% or close to 0% is formed. A thin film having a low light transmittance, such as a metallic chrome film, is used for the light-shielding film.

When a semi-transmission film, such as a multilayer film or a film having a low light transmittance due to absorption of light, is formed on the mask substrate 2, the semi-transmission portion 4 having reduced light transmittance is formed. For example, an oxide film, such as a chromium oxide film, is used as the semi-transmission film. The light transmittance of the semi-transmission portion 4 is arbitrarily set depending upon, for example, the type of photosensitive material and thickness of the thin film formed in the photolithography process.

The transmission portion 5 is patterned into an opening where thin films, like the films forming the light-shielding portion 3 and the semi-transmission portion 4, are not formed.

Figure 3:
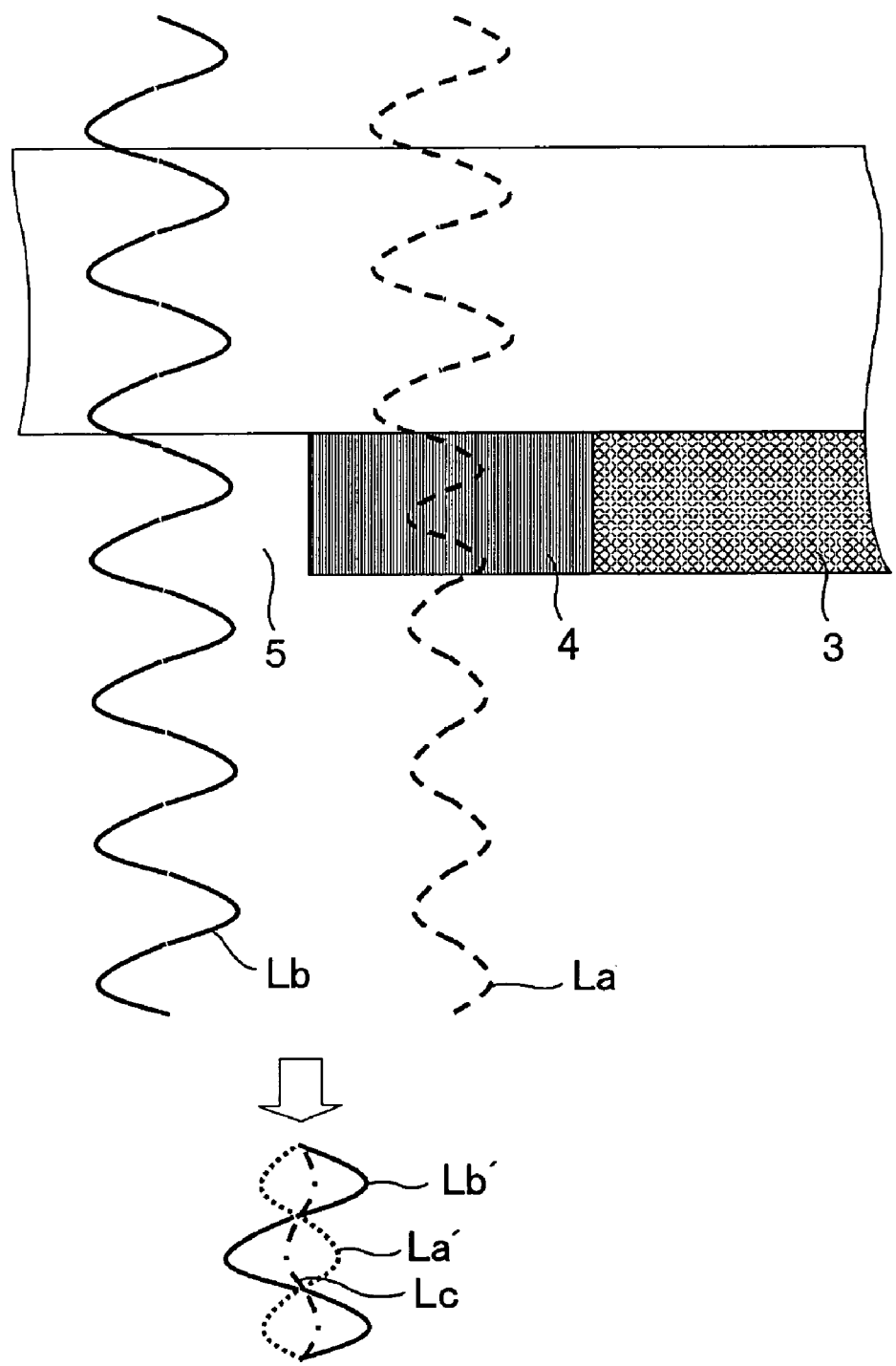
FIG. 3 illustrates transmission light passing through the photo-mask.

When the photolithography process is carried out using the photo-mask 1 having the above-described structure, a certain gap (hereinafter referred to as the "print gap") is provided between the photo-mask 1 and the substrate 11. When the size of the print gap becomes equal to or greater than a certain size with respect to the size of the photo-mask 1, the exposure light that has passed through the semi-transmission portion 4 and the transmission portion 5 is greatly diffracted. As shown in FIG. 3, when exposure light La passing through the semi-transmission portion 4 and exposure light Lb passing through the adjacent transmission portion 5 are diffracted, the diffracted lights (La' and Lb') interfere with each other at the boundaries of the semi-transmission portion 4 and the transmission portion 5, and are superimposed upon each other, thereby producing exposure light Lc. The intensity of the exposure light Lc is low when the interference of the diffracted lights La' and Lb' results in enhancing them. However, it is low when the interference results in weakening them. When the intensity of the exposure light Lc is low due to diffraction, a film-diminishing step is formed in the resist layer 12 that has been illuminated with the exposure light Lc during development after exposure, so that film deposition is not properly carried out. In addition, depending upon the sensitivity of a resist material, the illumination may become equal to or less than a limit illumination for a residual film, thereby resulting in a missing film portion, that is, a state where there is no residual film, or improper removal of a portion of or the entire resist layer 12.

In the photo-mask 1, the thickness and the refractive index of the semi-transmission film forming the semi-transmission portion 4 are prescribed, and the interference of diffracted lights at the boundaries of the semi-transmission portion 4 and the transmission portion 5 results in weakening the diffracted lights. Hereunder, a description of verifying the thickness and the refractive index of the semi-transmission film forming the semi-transmission portion 4 based on a simulation will be given.

Figure 4:
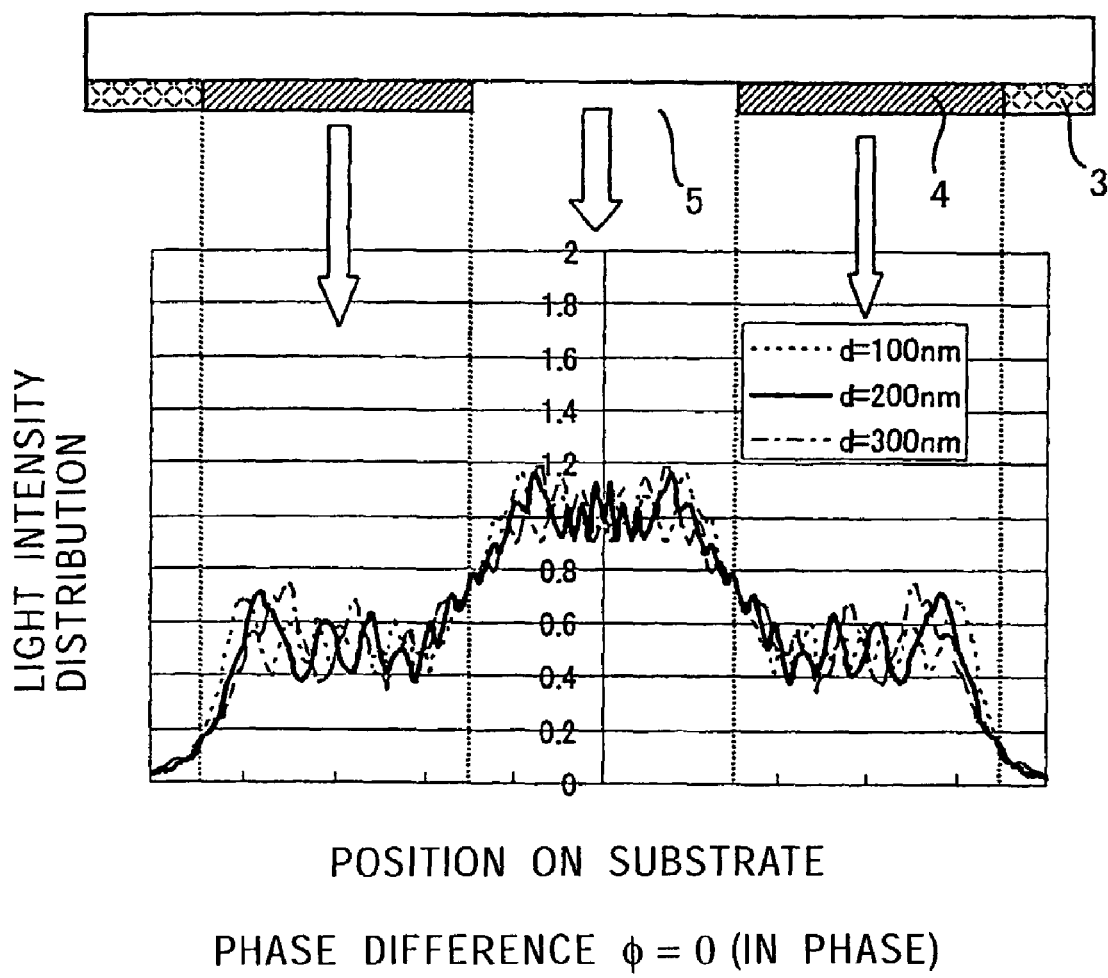
FIG. 4 is a characteristic diagram of a light-intensity distribution of the transmission light that passes through the photo-mask.
Figure 5:
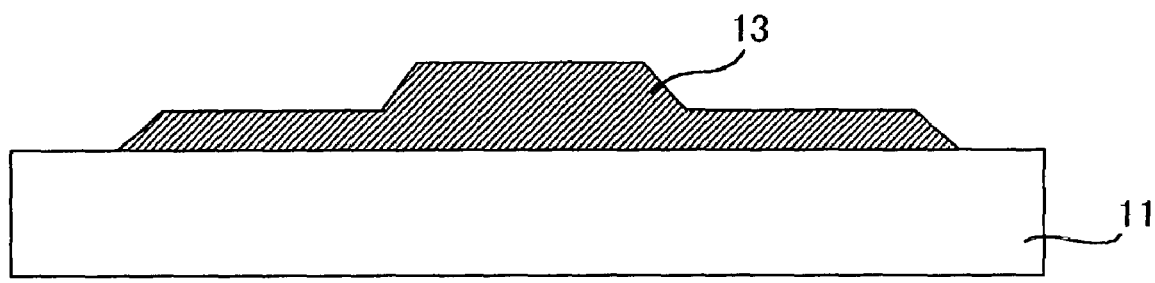
FIG. 5 is a sectional view of a thin-film pattern which is deposited with the light-intensity distribution shown in FIG. 4.

It is assumed that, in the photo-mask 1, the light transmittance of its semi-transmission portion 4 is 50% of the light transmittance of its transmission portion 5. In the photo-mask 1, when an attempt is made to bring the light passing through the semi-transmission portion 4 and the light passing through the transmission portion 5 in phase ($\phi=0$), the diffracted lights enhance each other. Therefore, as shown in the characteristic diagram of FIG. 4, the intensity of the exposure light Lc at the boundaries of the semi-transmission portion 4 and the transmission portion 5 is not low. In such a case, as shown in FIG. 5, a proper thin-film pattern 13 not having any film-diminishing steps is formed at the portion irradiated with the exposure light Lc situated in correspondence with the boundaries of the semi-transmission portion 4 and the transmission portion 5.

Figure 6:
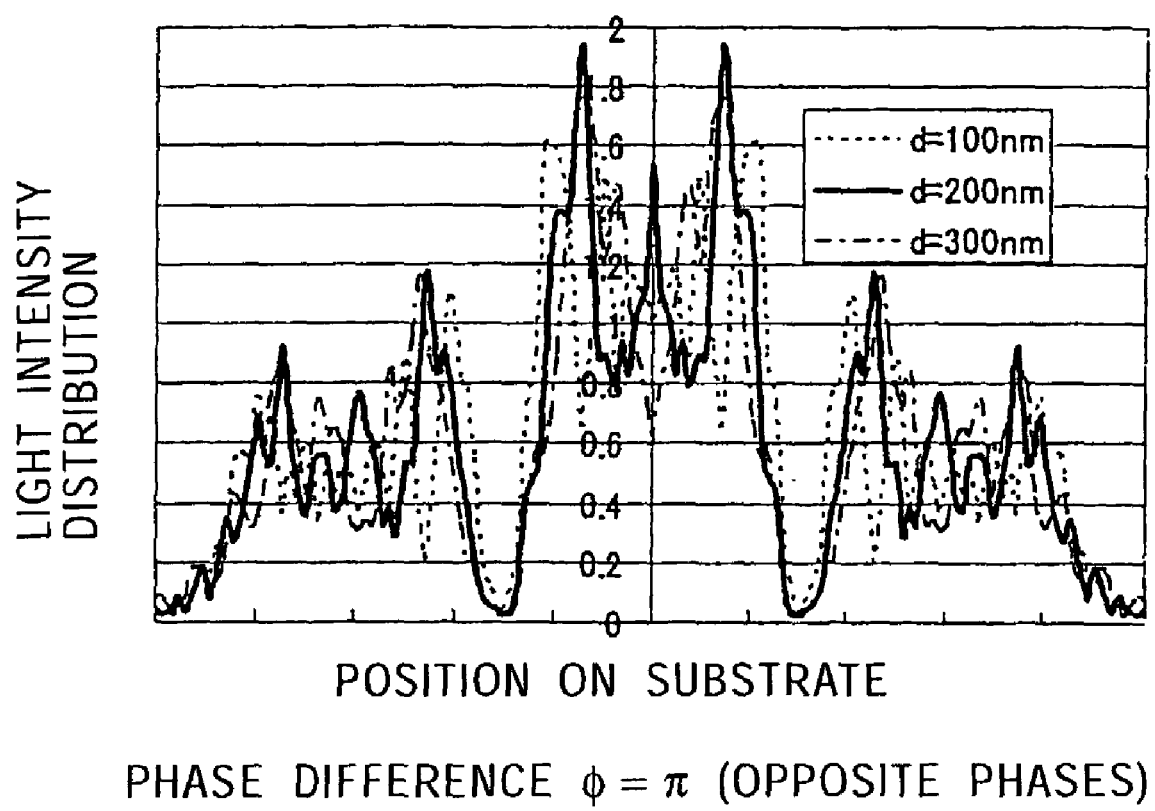
FIG. 6 is a characteristic diagram of a light-intensity distribution of the transmission light that passes through the photo-mask.
Figure 7:
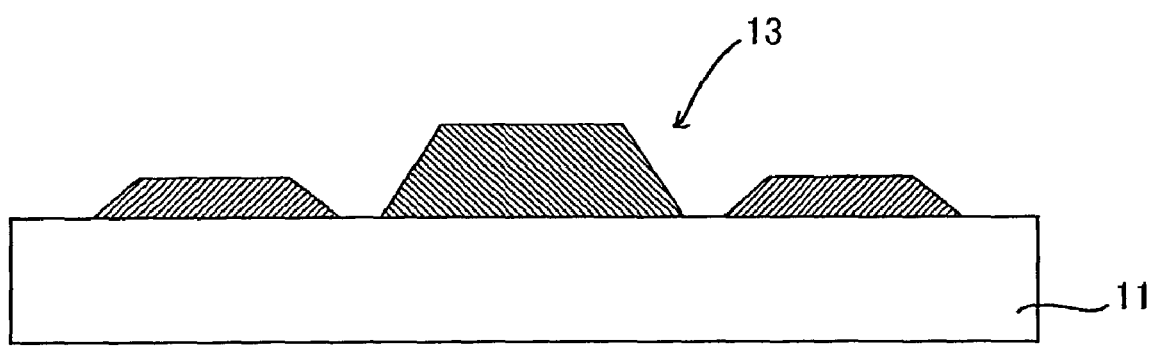
FIG. 7 is a sectional view of a thin-film pattern which is deposited with the light-intensity distribution shown in FIG. 6.

In contrast to this, when the light passing through the semi-transmission portion 4 and the light passing through the transmission portion 5 are out of phase by half a wavelength, that is, when the phase difference $\phi=\pi$, the diffracted lights interfere with each other and weaken each other. Therefore, as shown in the characteristic diagram of FIG. 6, the intensity of the exposure light Lc at the boundaries of the semi-transmission portion 4 and the transmission portion 5 is low. In such a case, as shown in FIG. 7, the portion irradiated with the exposure light Lc is decreased in thickness, so that an extremely thin portion is formed in the thin-film pattern 13 on the substrate 11, thereby resulting in improper film deposition.

Figure 8A:
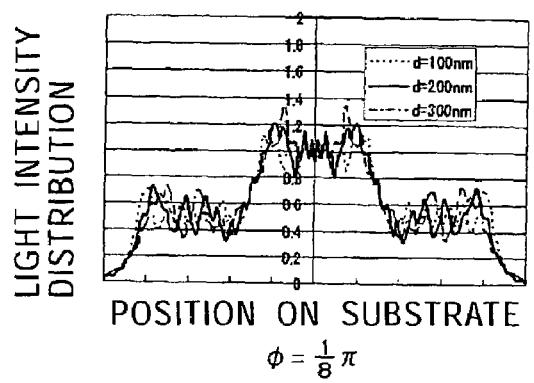
FIGS. 8A to 8D are characteristic diagrams of light-intensity distributions of the transmission light that passes through the photo-mask.
Figure 8B:
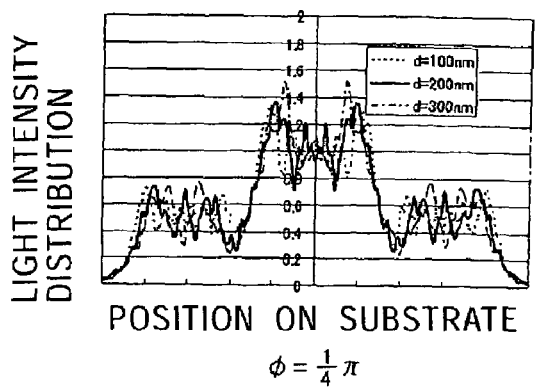
Figure 8C:
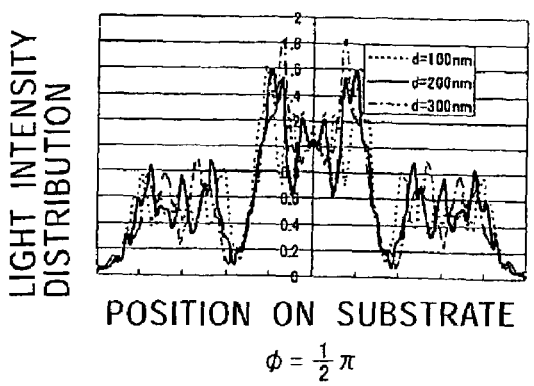
Figure 8D:
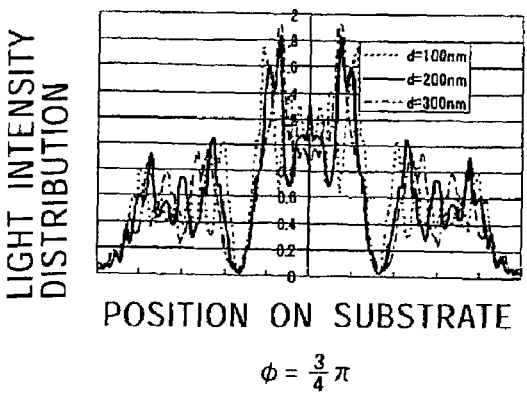

FIGS. 8A to 8D (FIG. 8D shows the thickness of the semi-transmission film forming the semi-transmission portion 4) illustrate the distribution of the intensity of the exposure light L when the phase difference of the exposure light La that has passed through the semi-transmission portion 4 and the exposure light Lb that has passed through the transmission portion 5 is varied. The film-diminishing steps formed in the respective thin-film patterns by the respective exposure lights L used to obtain the characteristic diagrams of FIGS. 8A to 8D, FIG. 4, and FIG. 6 were examined. When the phase differences were $\phi=0$ (FIG. 4), $\phi=\frac{1}{8}\pi$ (FIG. 8A), and $\phi=\frac{1}{4}\pi$ (FIG. 8B), the steps were small, so that they could be ignored for use. However, when the phase differences were $\phi=\pi$ (FIG. 6), $\phi=\frac{1}{2}\pi$ (FIG. 8C), and $\phi=\frac{3}{4}\pi$ (FIG. 8D), the steps were large, thereby resulting in improper film deposition. From these results, it can be judged that when the phase difference $\phi$ of the light that has passed through the semi-transmission portion 4 and the light that has passed through the transmission portion 5 is within the range of Formula (1) below, proper thin-film patterns 13 can be formed without any improper film deposition.

$$\left(-\frac{1}{4}+2m\right)\pi \leq \phi \leq \left(\frac{1}{4}+2m\right)\pi \ (m = \text{integer}) \quad (1)$$

In order to overcome the problem of improper film deposition mentioned above, in the photo-mask 1, the optical characteristics of the semi-transmission film forming the semi-transmission portion 4 are set so that the phase difference $\phi$ of the lights that have passed through the semi-transmission portion 4 and the transmission portion 5, respectively, is within the range of the Formula (1) on the substrate 11. Hereunder, examples of the thickness and the refractive index of the semi-transmission film forming the semi-transmission portion 4 are given. Here, it is assumed that the semi-transmission film forming the semi-transmission portion 4 is not affected by multiple reflection.

When the phase rotations at the time the lights pass through the respective semi-transmission portion 4 and the transmission portion 5 by a distance d equal to the thickness of the semi-transmission film forming the semi-transmission portion 4 are $\phi_1$ and $\phi_2$, the phase difference of the transmitted lights is determined by Formula (2) below:

$$\Delta\phi = \phi_2 - \phi_1 = \left(\frac{n_2}{n_1} - 1\right)\frac{2\pi d}{\lambda_1} \quad (2)$$

When the phase difference determined by Formula (2) is equal to an integral number of times a wavelength (Formula (3) below), the lights are in phase ($\phi=0$). When the phase difference is equal to an even number of times of half a wavelength (Formula (4) below), the lights have opposite phases ($\phi=\pi$).

$$\left(\frac{n_2}{n_1} - 1\right)d = m\lambda_1 \quad (m = \text{integer}) \quad (3)$$

$$\left(\frac{n_2}{n_1} - 1\right)d = \left(m + \frac{1}{2}\right)\lambda_1 \quad (m = \text{integer}) \quad (4)$$

Therefore, by forming the semi-transmission film forming the semi-transmission portion 4 so that an in-phase condition, indicated in Formula (3), is satisfied, a proper thin-film pattern 13 whose film-diminishing step situated in correspondence with the boundaries of the semi-transmission portion 4 and the transmission portion 5 is small can be provided on the substrate 11. More specifically, when the refractive index and the thickness of the semi-transmission film are $n_2$ and d, respectively, the semi-transmission film is designed with a thickness and a refractive index that satisfy the following Formula (5) in terms of a wavelength $\lambda$ of the exposure light. In this case, $n_1$ in Formula (5) is the refractive index of an air space. In order to adjust the phase difference, a different transmission film may be formed at the transmission portion instead of the air space.

$$\left(\frac{n_2}{n_1} - 1\right)d = m\lambda \quad (m = \text{integer}) \quad (5)$$

Therefore, in order to satisfy the condition of Formula (1), the refractive index and the thickness of the semi-transmission film are set so as to satisfy the following Formula (6).

$$\left(m - \frac{1}{8}\right)\lambda \le \left(\frac{n_2}{n_1} - 1\right)d \le \left(m + \frac{1}{8}\right)\lambda \quad (m = \text{integer}) \quad (6)$$

Actually, the light transmittance of the semi-transmission film forming the semi-transmission portion 4 needs to be adjusted to between 0% and 100% depending on, for example, the intended use. Examples of methods of adjusting the light transmittance are the method of controlling the absorptivity (attenuation coefficient) of the semi-transmission film and the method of forming an interference filter based on multiple reflection. One must be careful when there is multiple reflection because the phases rotate. In this case, since the obtained result deviates from the condition of Formula (6), the thickness, refractive index, and the attenuation coefficient of the semi-transmission film are set so that they ultimately satisfy the condition of Formula (1). In the case where the light absorption of the semi-transmission film itself is sufficiently large in the case where the absorptivity is controlled, multiple reflection can be ignored, so that the phases are not rotated. Therefore, the condition of Formula (6) can be used.

Figure 9:
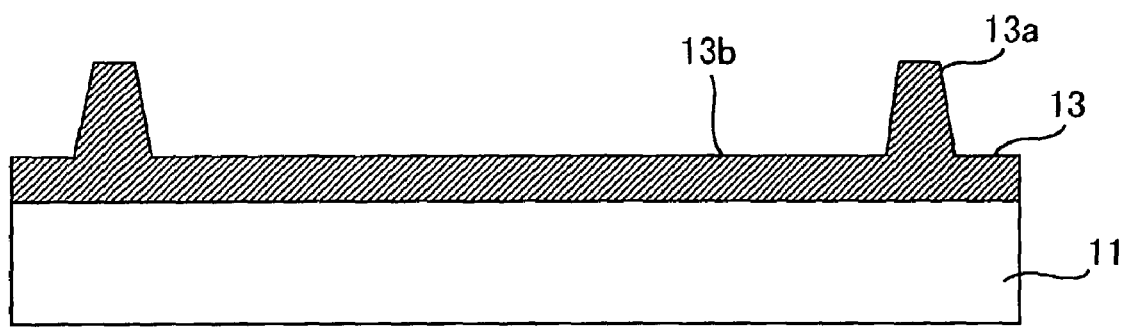
FIG. 9 is a sectional view of a specific example of the thin-film pattern which is deposited using the photo-mask with no phase difference of lights at a transmission portion and at a semi-transmission portion.
Figure 10:
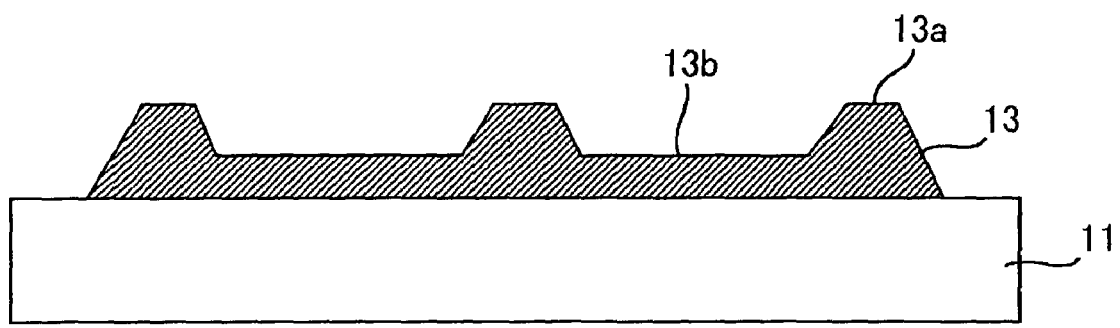
FIG. 10 is a sectional view of another specific example of the thin-film pattern which is deposited using the photo-mask.

The photo-mask 1 in which the thickness and the refractive index of the semi-transmission film forming the semi-transmission portion 4 are prescribed as mentioned above makes it possible to restrict the formation of unwanted steps caused by the effects of diffraction, thereby making it possible to prevent improper film deposition. The photo-mask 1 can be used in forming a thin-film pattern 13 having the form shown in FIG. 9 and a thin-film pattern 13 having the form shown in FIG. 10 by the photolithography process. The thin-film pattern 13 shown in FIG. 9 may be formed, for example, when protruding portions 13*a*, which are spacers for forming a cell gap in a liquid crystal display device, and a flat portion 13*b*, which becomes a color filter or a planarizing film, are formed at the same time. The thin-film pattern 13 shown in FIG. 10 may be formed when forming protruding portions 13*a*, which become alignment walls, and a flat portion 13*b*, which becomes a color filter, a planarizing film, or a spacer, are formed at the same time in a liquid crystal display device making use of an orientation mode of liquid crystals using protrusions, such as ASM mode or MVA mode.

Figure 11:
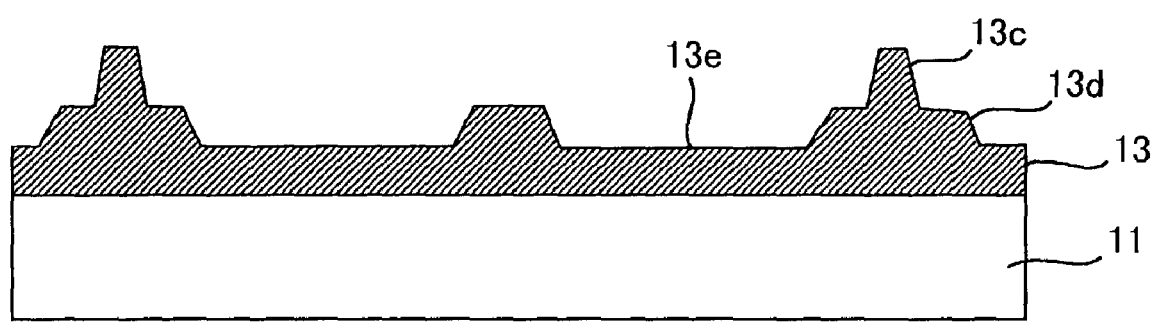
FIG. 11 is a sectional view of still another specific example of the thin-film pattern which is deposited using the photo-mask.

Although the above-described photo-mask 1 is described as having two types of transmission areas, the semi-transmission portion 4 and the transmission portion 5, it is possible to form a thin-film pattern 13 having the form shown in FIG. 11 by the addition of a second semi-transmission portion, more specifically, having a three-step structure. The thin-film pattern 13 shown in FIG. 11 may be formed when first protruding portions 13*c* and second protruding portions 13*d*, which become spacers or alignment walls, are formed at the same time on a flat portion 13*e*, which becomes a planarizing film. The thin-film patterns that can be formed using the photo-mask 1 are not limited to the thin-film patterns having the above-described two-step and three-step structures, so that thin-film patterns having various forms can be formed by variously changing the number of transmission areas, the light transmittances, or other such conditions.

Figure 12:
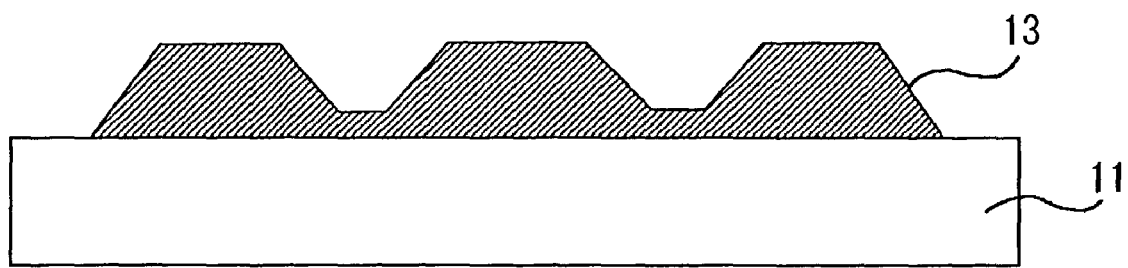
FIG. 12 is a sectional view of a specific example of the thin-film pattern which is deposited using the photo-mask with the phase difference of lights at the transmission portion and at the semi-transmission portion being arbitrarily set.
Figure 13:
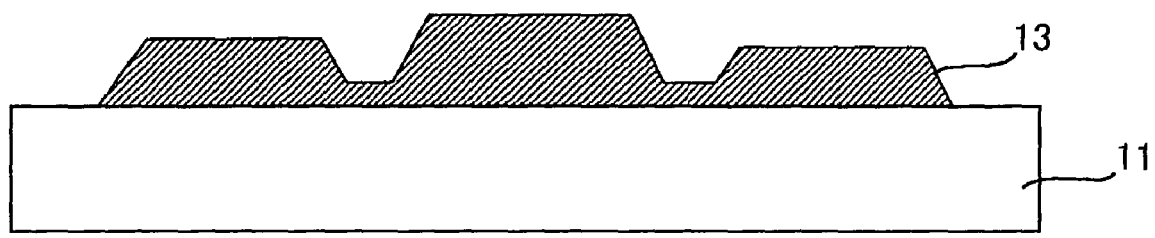
FIG. 13 is a sectional view of another specific example of the thin-film pattern which is deposited using the photo-mask.

The thickness and the refractive index in the above-described photo-mask 1 are prescribed so that the phase difference is kept within a certain range in order to prevent the formation of unwanted steps, which are produced due to the effects of diffraction. However, when a pattern having more complicated steps or a pattern having a structure with an enhanced edge is to be formed onto the substrate 11, it is possible to, on the contrary, positively use the steps formed by the effects of diffraction. More specifically, by bringing light passing through the semi-transmission portion 4 and light passing through the transmission portion 5 out of phase and arbitrarily setting the phase difference outside the range of Formula (1), the intensity of the exposure light Lc at a location corresponding to the boundaries of the semi-transmission portion 4 and the transmission portion 5 is adjusted, so that a film-diminishing step formed at a location corresponding to the boundaries is used for the form of the thin-film pattern 13. In this way, by using the film-diminishing step for the form of the thin-film pattern 13, a number of steps equal to or greater than the number of transmission areas in the photo-mask 1 can be formed. The photo-mask 1 can be used when forming a thin-film pattern 13 having the form shown in FIG. 12 and a thin-film pattern 13 having the form shown in FIG. 13 by the photolithography process. The thin-film pattern 13 shown in FIG. 12 can be formed with the illustrated form by setting the light transmittance of the semi-transmission portion 4 approximately equal to the light transmittance of the transmission portion 5 and by shifting only the phase by, for example, half a wavelength. By arbitrarily setting the light transmittance of the semi-transmission portion 4 different from the light transmittance of the transmission portion 5, and by arbitrarily changing the wavelengths of the exposure lights passing through both of them, a thin film having a complicated form such as that shown in FIG. 13 can be deposited.

Hereunder, a method of forming a thin film using the photo-mask 1 having the above-described structure will be described. In the embodiment described below, the case where a thin-film pattern 13 having a two-step structure is formed onto the substrate 11 will be described.

Figure 14A:
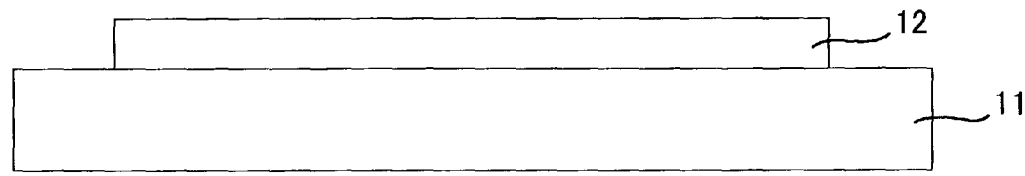
FIGS. 14A to 14C are sectional views for illustrating a film deposition step of a method of forming a thin film according to the present invention.
Figure 14B:
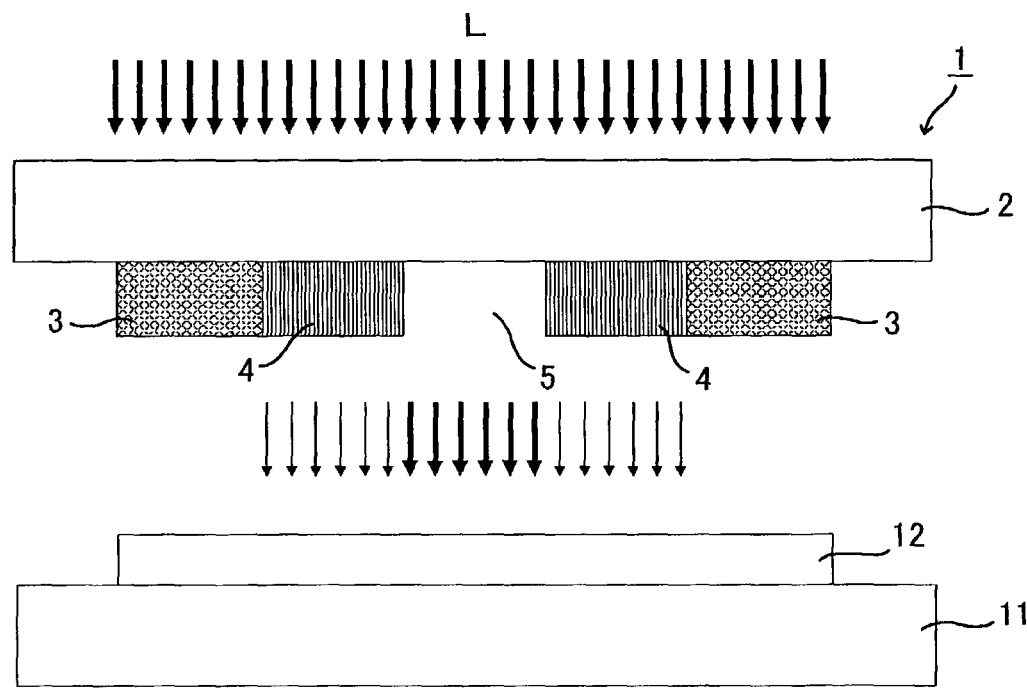
Figure 14C:
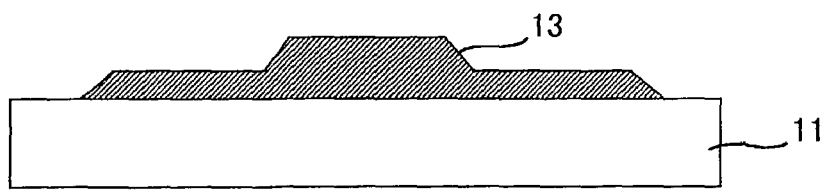

As shown in FIG. 14A, a negative photosensitive material is applied to the substrate 11 in order to form the resist layer 12. Then, the photo-mask 1 is positioned with respect to the substrate 11, after which, as shown in FIG. 14B, the resist layer 12 is irradiated with the exposure light L. At this time, the photo-mask 1 is spaced from what is to be subjected to a thin-film forming operation, more specifically, the resist layer 12 formed on the substrate 11, with a print gap having a size between 50 μm and 500 μm inclusive being provided therebetween. After the exposure operation, the resulting structure is cleaned with cleaning fluid to remove the unexposed portion, so that, as shown in FIG. 14C, a desired thin-film pattern 13 is formed. Although, here, the procedure for forming the thin film is simply described, regarding the type of photosensitive material applied to the substrate 11, the type of cleaning fluid used in the cleaning process, etc., which are conditions other than the conditions for the print gap, appropriate related materials, cleaning fluids, etc., may be selected and used, depending upon, for example, the type of thin film to be formed.

The above-described method of forming a thin film makes it possible to form the thin film comprising portions of variously combined thicknesses by a single process as a result of changing the combination of a ratio between the light transmittances of the semi-transmission portion 4 and the transmission portion 5 of the photo-mask 1 and the sensitivity behavior of the photosensitive material applied to the substrate 11, so that this method may be used when a thin film needs to be formed with a plurality of thicknesses using the same material.

Since, in the above-described method of forming a thin film, the exposure operation is carried out with a relatively large gap having a size between 50 μm and 500 μm inclusive between the photo-mask 1 and what is to be subjected to a thin-film forming operation, even if, for example, a large substrate is used, it is possible to prevent contact between the photo-mask 1 and the substrate 11 as well as the resist layer 12 on the substrate 11, so that it is possible to carry out a larger scale photolithography process.

By the same process as the above-described method of forming a thin film, when the exposure lights passing through the transmission portion 5 and the semi-transmission portion 4 of the photo-mask 1 are brought out of phase, it is possible to obtain a pattern in which the number of steps thereof is equal to or greater than the number of areas of the photo-mask 1.

Figure 15:
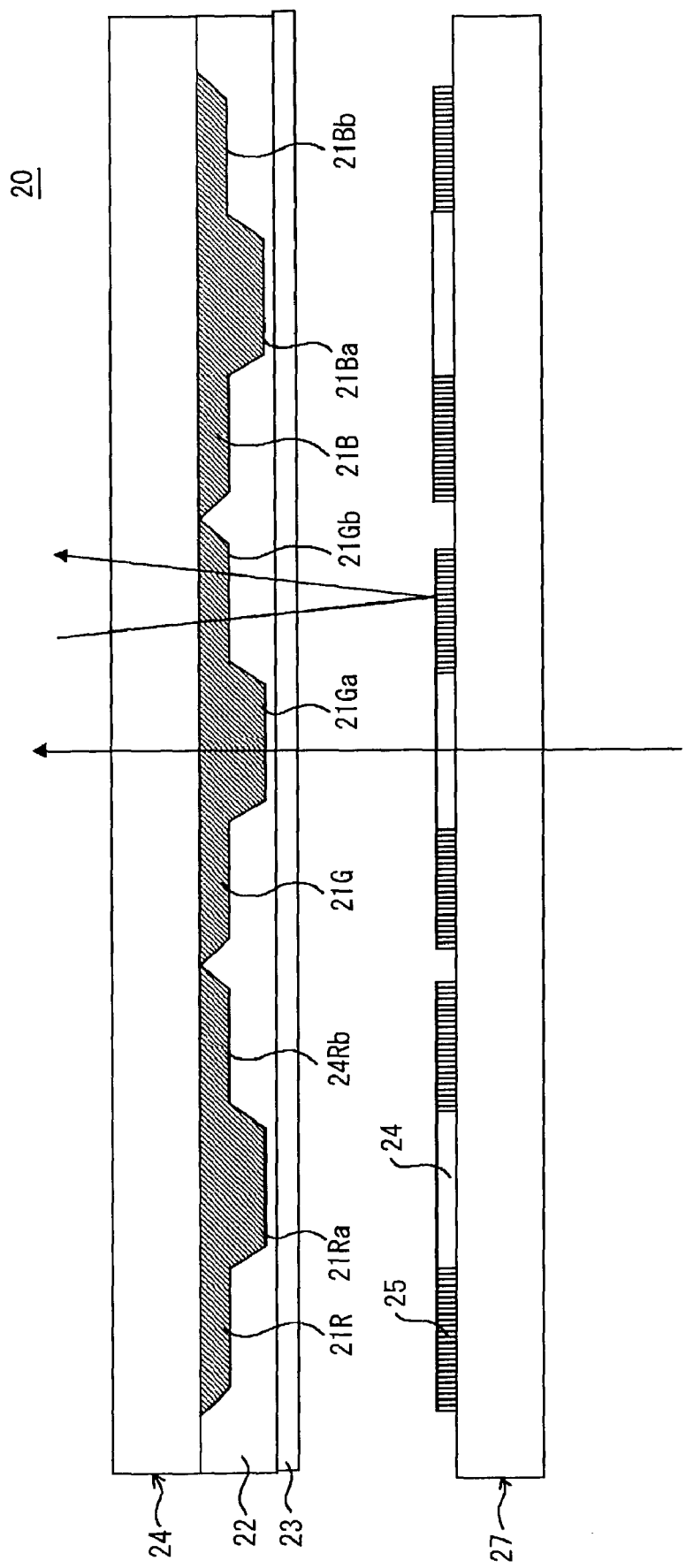
FIG. 15 is a sectional view of the general structure of a liquid crystal display device to which the present invention is applied.

A description of a method of producing a liquid crystal display device in which the above-described method of forming a thin film is carried out in the photolithography process will be given. As shown in FIG. 15, a liquid crystal display device 20 comprising color filters 21R, 21G, and 21B of the respective colors red (R), green (G), and blue (B) are formed. (These will be called the color filters 21 when the colors do not have to be distinguished.) In addition, a first substrate 24 and a second substrate 27 are disposed so as to oppose each other, and liquid crystals are injected therebetween. A planarizing layer 22, formed of organic transparent resin, and an opposing electrode 23, formed of an electrically conductive thin film such as an ITO film, are formed on the first substrate 24. Reflective electrodes 25, functioning as reflective plates and pixel electrodes, and a transparent electrode 26, formed of an electrically conductive thin film such as an ITO film, are formed on the second substrate 27. The liquid crystal display device 20 is formed with a two-step structure in which the color filters 21R, 21G, and 21B comprise respective transmission filter portions 21Ra, 21Ga, and 21Ba, and respective reflective filter portions 21Rb, 21Gb, and 21Bb at locations opposing the transparent electrode 26. The transmission filter portions 21Ra, 21Ga, and 21Ba are formed one step higher than the reflective filter portions 21Rb, 21Gb, and 21Bb, respectively. The reflective filter portions 21Rb, 21Gb, and 21Bb are formed one step lower than and on both sides of the respective transmission filter portions 21Ra, 21Ga, and 21Ba. The transmission filter portions 21Ra, 21Ga, and 21Ba and the reflective filter portions 21Rb, 21Gb, and 21Bb are integrally formed.

Since the liquid crystal display device 20 comprises a transmissive display structural portion passing light and a reflective display structural portion not transmitting light, both transmissive display and reflective display can be carried out. By this, for example, at a place where the surrounding area is bright, a display image can be recognized by using the reflective display structural portion; and at a dark place or the like, a display image can be recognized using both the transmissive display structural portion and the reflective display structural portion with the transmissive display structural portion being mainly used. Forming the color filters 21 so that they comprise the respective transmission filter portions 21Ra, 21Ga, and 21Ba and the reflection filter portions 21Rb, 21Gb, and 21Bb having different thicknesses, respectively, it is possible to perform a displaying operation with the proper light transmittance and chromaticity in both display by transmission and display by reflection.

Although details are not shown in FIG. 15, a plurality of scanning lines, a plurality of reference signal lines, a common wire, and thin-film transistors (TFT) are formed on the second substrate 27. The scanning lines are disposed substantially parallel to each other. The reference signal lines are disposed substantially parallel to each other. The reference signal lines and the scanning lines are alternately disposed. The common wire connects the reference signal lines together. The thin-film transistors are three-terminal switching elements which are provided for the respective reflective electrode 25 and which selectively drive the reflective electrodes 25.

In the liquid crystal display device 20 having the structure described above, the method of forming a thin film using the above-described photo-mask 1 is carried out in the photolithography process in order to form the color filters 21R, 21G, and 21B having two-step structures. In the photolithography process, a negative photoresist comprising a pigment of a desired color is used to form the color filters 21R, 21G, and 21B of the respective colors. First, a color resist comprising a red pigment is applied to the first substrate 24 to a predetermined thickness and dried, thereby forming a red resist film. Next, a predetermined area of the red resist film, that is, the area to be left as the color filter 21R is exposed from the front side thereof using the photo-mask 1, and the exposed area of the red resist film is hardened. Then, the exposed area of the red resist film is developed and the unexposed area is removed. Here, since a semi-transmission film forms the semi-transmission portion 4 so that the exposure light passing through the semi-transmission portion 4 and the exposure light passing through the transmission portion 5 are in phase, it is possible to obtain a pattern having a proper two-step structure without any improper film deposition caused by film diminishing steps. The red resist film having a two-step structure remaining on the first substrate 24 is the color filter 21R. Thereafter, like the color filter 21R, the other color filters 21G and 21B are successively formed by coating, exposing, and developing a color resist comprising a green pigment, and, then, coating, exposing, and developing a color resist comprising a blue pigment.

As described above, by carrying out the method of forming a thin film using the photo-mask 1 in the photolithography process carried out when producing the liquid crystal display device 20, the transmission and reflective color filter portions forming two step structures of the transmissive-and-reflective liquid crystal display device can be formed by a single process. Therefore, the method of producing the liquid crystal display device 20 makes it possible to reduce the number of times the photolithography process is carried out and to increase production efficiency.

According to the method of producing the liquid crystal display device 10, since the photolithography process is carried out with a relatively large gap having a size between 50 μm and 500 μm inclusive being provided between the photo-mask 1 and what is to be subjected to a thin-film forming operation, it is possible to prevent contact between the photo-mask 1 and the substrate 11 as well as the resist layer 12 formed thereon, even in the process of producing a liquid crystal display device having a large screen.

As described in detail above, according to the mask for photolithography of the present invention, the structures of the transmission films forming the transmission areas, more specifically, the thickness and the refractive index of the transmission films are such that the lights passing through a plurality of transmission areas having different light transmittances are in phase, thereby preventing a reduction in the intensities of the exposure lights caused by interference between the diffracted lights at the boundaries of the transmission areas. Therefore, the mask for photolithography of the present invention makes it possible to form by a single process a proper thin film having a plurality of steps in which the formation of film-diminishing steps is restricted.

According to the method of forming a thin film, the liquid crystal display device, and the method of producing the liquid crystal display device of the present invention, the mask for photolithography having the above-described structure is used to form a thin-film pattern onto what is to be subjected to a thin-film forming operation, such as a glass substrate, thereby making it possible to properly form a thin film having a plurality of steps by a single process without any improper film deposition, to increase productivity of the liquid crystal display device, and to reduce costs. In addition, according to the method of forming a thin film, the liquid crystal display device, and the method of producing the liquid crystal display device of the present invention, the mask for photolithography having the above-described structure is used to carry out the photolithography process with a relatively large gap having a size between 50 μm to 500 μm inclusive being provided between the mask and what is to be subjected to a thin-film forming operation, thereby making it possible to prevent contact between the mask and what is to be subjected to a thin-film forming operation. Therefore, it is possible to carry out a larger scale photolithography process such as that using a large substrate material.

According to the mask for photolithography of the present invention, by arbitrarily setting the phase difference of lights passing through a plurality of transmission areas, it is possible to properly form by a single process a complicated thin-film pattern having, for example, a structure having minute steps.

According to the method of forming a thin film, the liquid crystal display device, and the method of producing the liquid crystal display device of the present invention, the use of the mask for photolithography having the above-described structure makes it possible to easily form a thin-film pattern having a complicated structure by a single process, to increase productivity of the liquid crystal display device, and to reduce costs. In addition, according to the method of forming a thin film, the liquid crystal display device, and the method of producing the liquid crystal display device of the present invention, the mask for photolithography is used to carry out exposure with a relatively large gap having a size between 50 μm and 500 μm inclusive being provided between the mask and what is to be subjected to a thin-film forming operation. Therefore, it is possible to prevent contact between the mask and what is to be subjected to a thin-film forming operation, and to make it possible to carry out a larger scale photolithography process such as that using a large substrate material.

What is claimed is:

1. A mask for photolithography comprising:
   a light-shielding area; and
   a plurality of transmission areas having different light transmittances;
   wherein a phase difference of lights passing through adjacent transmission areas of the plurality of transmission areas is between $(-\frac{1}{4}+2\text{ m})\pi$ and $(\frac{1}{4}+2\text{ m})\pi$ inclusive, where m is an integer.

2. A method of forming a thin film by providing a mask for photolithography comprising a light-shielding area and a plurality of transmission areas having different light transmittances, and subsequently irradiating the mask with light, such that a phase difference of lights passing through adjacent transmission areas of the plurality of transmission areas is between $(-\frac{1}{4}+2\text{ m})\pi$ and $(\frac{1}{4}+2\text{ m})\pi$ inclusive, where m is an integer.

3. A method of forming a thin film according to claim 2, wherein the mask for photolithography is disposed with a gap having a size between 50 μm and 500 μm inclusive, being provided between it and an object to be subjected to a thin-film forming operation.

4. A method of producing a liquid crystal display device comprising the step of:
   carrying out a photolithography process in which exposure is performed using a mask for photolithography comprising a light-shielding area and a plurality of transmission areas having different light transmittances, wherein, in the mask for photolithography, a phase difference of lights passing through adjacent transmission areas of the plurality of transmission areas is between $(-\frac{1}{4}+2\text{ m})\pi$ and $(\frac{1}{4}+2\text{ m})\pi$ inclusive, where m is an integer.

5. A method of producing a liquid crystal display device according to claim 4, wherein the mask for photolithography is disposed with a gap, having a size between 50 μm and 500

μm inclusive, being provided between it and an object to be subjected to a thin-film forming operation.

6. A liquid crystal display device comprising:

a substrate having a thin-film pattern formed thereon by exposure using a mask for photolithography comprising a light-shielding area and a plurality of transmission areas having different light transmittances, wherein, in the mask for photolithography, a phase difference of lights passing through adjacent transmission areas of the plurality of transmission areas is between $(-\frac{1}{4}+2m)\pi$ and $(\frac{1}{4}+2m)\pi$ inclusive, where m is an integer.

7. A liquid crystal display device according to claim 6, wherein the thin-film pattern is formed by exposure with the mask for photolithography being disposed with a gap, having a size between 50 μm and 500 μm inclusive, being provided between it and an object to be subjected to a thin-film forming operation.

* * * * *